US006272068B1

(12) United States Patent
La et al.

(10) Patent No.: US 6,272,068 B1
(45) Date of Patent: Aug. 7, 2001

(54) INTEGRATED CIRCUIT MEMORY DEVICES THAT UTILIZE DATA MASKING TECHNIQUES TO FACILITATE TEST MODE ANALYSIS

(75) Inventors: One-gyun La, Seoul; Jung-bae Lee; Si-yeol Lee, both of Kyungki-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/667,379

(22) Filed: Sep. 22, 2000

Related U.S. Application Data

(62) Division of application No. 09/356,269, filed on Jul. 16, 1999, now Pat. No. 6,151,272.

(30) Foreign Application Priority Data

Jul. 16, 1998 (KR) ................................................ 98-28847

(51) Int. Cl.[7] ...................................................... G11C 8/00
(52) U.S. Cl. ...................................... 365/233; 365/230.08
(58) Field of Search ............................... 365/233, 230.08

(56) References Cited

U.S. PATENT DOCUMENTS 5,521,878 5/1996 Ohtani et al. ........................ 365/191
5,703,828 * 12/1997 Park et al. ...................... 365/230.03

* cited by examiner

*Primary Examiner*—David Nelms
*Assistant Examiner*—M. Tran
(74) *Attorney, Agent, or Firm*—Myers Bigel Sibley & Sajovec

(57) ABSTRACT

Integrated circuit memory devices that utilize preferred masking techniques include a memory cell array and a mask signal generator that generates first and second internal data masking signals in response to at least one single data rate mode signal. A data controller is also provided to pass input write data to the memory cell array when the first and second internal data masking signals are inactive and mask at least a portion of the input write data from the memory cell array when one of the first and second internal data masking signals is active. This ability to mask data facilitates operation of the memory device in a specialized single data rate mode for testing using conventional test equipment.

14 Claims, 8 Drawing Sheets

PCLK
CLK
CLKB
CL1 '1'
CLKDQ_F '1'
CLKDQ_S '0'
DB_F a b c d
DB_S e f g h
DOi a b c d 161,561
DM
DMEN
211
PDS
PDS
221
224
PDS
222
PCLK
223
225
231
BL1
DM_F
DM_S
D
Q 171,571
DINi
DINEN
311
PDINi
PDS
321
D
Q
324
D
Q
322
D
Q
PDS
DiF_F
DiF_S
PCLK
323
D
Q
325
D
Q
Di_F
Di_S
312
313
DM_F
DM_S
Did_F
Did_S

CLK
511
521
523
RISING PULSE GENERATOR
525
FALLING PULSE GENERATOR
PDUAL
527
PCLK
CL1
531
CL1
DS
551
PCLK
PCLKDS
541
543
545
PDS
PCLK
BL1
DM
561
FIRST CON-TROLLER
DMEN
DM_F
DM_S
571
SECOND CON-TROLLER
DINi
PDS
DINEN
PCLK
Did_F
Did_S
DRAM CELL ARRAY

DOi
752
743
761
731
751
741
742
CLKDQ_F
DB_F
DB_S
CLKDQ_S
721
724
727
723
726
CL1
PCLKDQ_F
PCLKDQ_S
CL1
711
CLK
CLKB

INTEGRATED CIRCUIT MEMORY DEVICES THAT UTILIZE DATA MASKING TECHNIQUES TO FACILITATE TEST MODE ANALYSIS

This application is a division of application Ser. No. 09/356269 filed Jul. 16, 1999 now U.S. Pat. No. 6,151,272.

RELATED APPLICATION

This application is related to Korean Application No. 98-28847, filed Jul. 16, 1998, the disclosure of which is hereby incorporated herein by reference.

FIELD OF THE INVENTION

The present invention relates to integrated circuit devices, and more particularly to integrated circuit memory devices.

BACKGROUND OF THE INVENTION

Single data rate (SDR) synchronous DRAM integrated circuits have been developed in order to improve the performance of conventional dynamic random access memory (DRAM) integrated circuits. In additional, double data rate (DDR) synchronous DRAM integrated circuits have been developed in order to improve the performance of single data rate synchronous DRAM integrated circuits. Single data rate synchronous DRAM integrated circuit devices process one data value during one period of a clock signal. Double data rate synchronous DRAM integrated circuits process two data values during one period of a clock signal. Therefore, the double data rate synchronous DRAM integrated circuit can have a data processing speed twice as high as that of the single data rate synchronous DRAM integrated circuit.

Because the double data rate synchronous DRAM integrated circuit has a very high data processing speed, the performance of the double data rate synchronous DRAM integrated circuit typically cannot be tested with low speed data equipment. For example, the operating frequency of the double data rate synchronous DRAM integrated circuit presently is about 100 MHz and the operating frequency of conventional test equipment for testing a wafer on which DRAM integrated circuits are arranged presently is only about several MHz (e.g., 5 MHz). Also, since the double data rate synchronous DRAM integrated circuit has a specific pin called a data strobe, the double data rate synchronous DRAM integrated circuit typically can only be tested by enabling the data strobe pin from the outside. Since conventional test equipment typically does not have the capability of enabling the data strobe pin, double data rate synchronous DRAM integrated circuits typically cannot be tested with conventional test equipment. Thus, notwithstanding the advantages of double data rate SDRAM deices, there continues to be a need for improved techniques to test such devices using conventional test equipment.

SUMMARY OF THE INVENTION

It is therefore an object of the present invention to provide integrated circuit memory devices that can be accurately and reliably tested using conventional test equipment.

These and other objects, advantages and features of the present invention can be provided by a double data rate (DDR) synchronous dynamic random access memory device (SDRAM) that comprises a memory cell array and a mask signal generator that generates first and second internal data masking signals (e.g., DM_F, DM_S) during test mode, in response to at least one single data rate mode signal (e.g., CL1). A data controller is also provided to pass input write data to the memory cell array when the first and second internal data masking signals are inactive during normal operation and mask at least a portion of the input write data from the memory cell array when one of the first and second internal data masking signals (e.g., DM_S) is active during test mode operation. This ability to mask data facilitates operation of the DDR SDRAM in a specialized single data rate (SDR) mode for testing using conventional test equipment.

Moreover, according to a preferred aspect of the present invention, the mask signal generator is responsive to first and second single data rate mode signals (CL1, BL1) and comprises a buffer that has a data input that receives an external data strobe signal (DS) and a control input that receives one of the first and second single data rate mode signals (e.g., CL1). The mask signal generator also preferably comprises an internal data strobe signal generator that receives as inputs a data strobe clock signal (PCLKDS) and an output of the buffer, and generates an internal data strobe signal (PDS). The mask signal generator may also comprise a NAND gate that receives as inputs an internal clock signal and one of the first and second single data rate mode signals (e.g., CL1) and generates the data strobe clock signal (PCLKDS) in response thereto. A mask signal controller is also preferably provided. The mask signal controller generates first and second internal data masking signals (DM_F, DM_S) in response to the internal data strobe signal (PDS) and a data masking signal (DM). The mask signal controller is also responsive to one of the first and second single data rate mode signals (e.g., CL1) and the data controller is responsive to the internal data strobe signal (PDS).

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
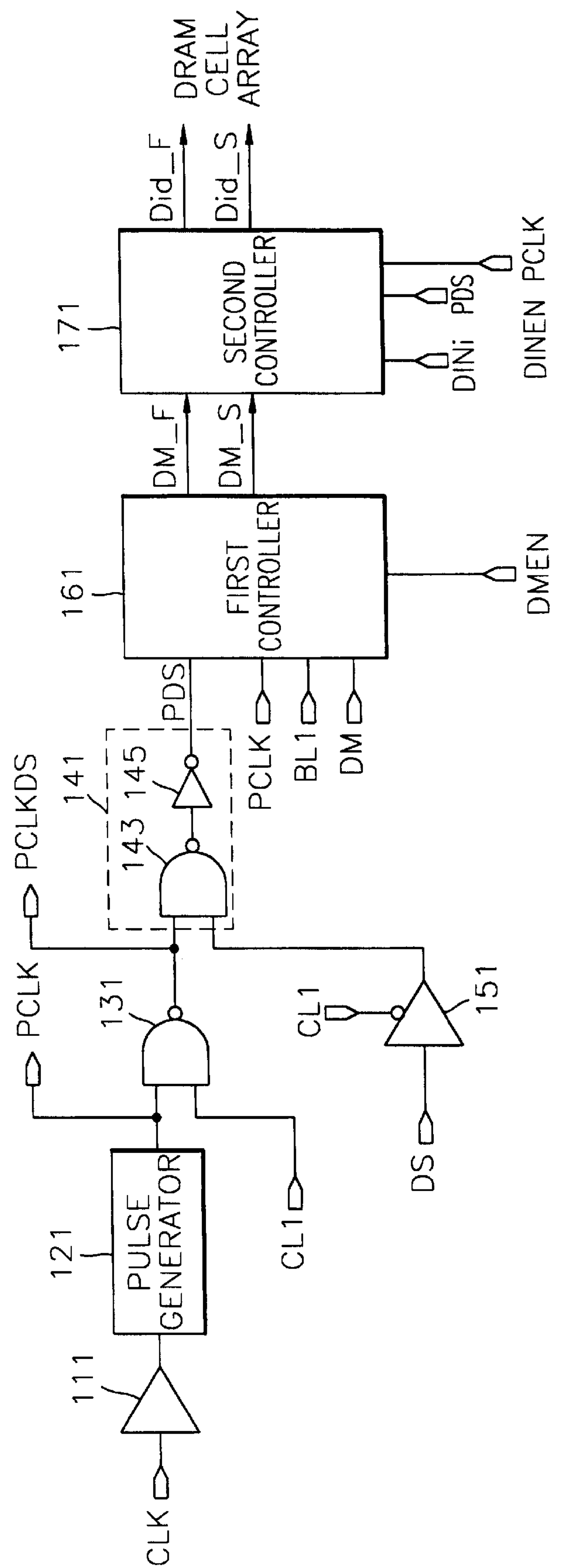
FIG. 1 is an electrical schematic of an integrated circuit memory device according to a first embodiment of the present invention.

FIG. 1 is a circuit diagram of a double data rate synchronous DRAM integrated circuit according to a first embodiment of the present invention. Referring to FIG. 1, the double data rate synchronous DRAM integrated circuit according to the first embodiment of the present invention includes first and second buffers 111 and 151, a pulse generator 121, first and second logic circuits 131 and 141, and first and second controllers 161 and 171. The first buffer 111 receives as an input an external clock signal CLK and converts the voltage level of the external clock signal CLK. For example, the first buffer 111 converts the external clock signal CLK from a transistor logic (TTL) level into a clock signal of a complementary metal oxide semiconductor (CMOS) level. The pulse generator 121 accepts as an input the output from the first buffer 111 and generates an internal clock signal PCLK. The pulse generator 121 generates the internal clock signal PCLK whenever the external clock signal CLK rises from logic low to logic high.

The first logic circuit 131 receives as an input a first single data rate mode signal CL1 input from the outside and the internal clock signal PCLK, and generates a data strobe clock signal PCLKDS. The first logic circuit 131 outputs the data strobe clock signal PCLKDS in response to the internal clock signal PCLK when the first single data rate mode signal CL1 is activated to logic high, and does not generate the data strobe clock signal PCLKDS when the first single data rate mode signal CL1 is deactivated to logic low. Namely, the first logic circuit 131 includes a NAND gate for performing a NAND operation on the internal clock signal PCLK and the first single data rate mode signal CL1. Therefore, the data strobe clock signal PCLKDS becomes logic high when either the internal clock signal POLK or the first single data rate mode signal CL1 is logic low and becomes logic low when both the internal clock signal PCLK and the first single data rate mode signal CL1 are logic high. The first single data rate mode signal CL1 is activated when a column address strobe (CAS) latency is 1.

The second buffer 151 receives as an input an external data strobe signal DS and the first single data rate mode signal CL1. The second buffer 151 changes the voltage level of the external data strobe signal DS in response to the first single data rate mode signal CL1. The second buffer 151 outputs logic high when the first single data rate mode signal CL1 is activated to logic high, and generates an output in response to the external data strobe signal DS when the first single data rate mode signal CL1 is deactivated to logic low. Namely, the output of the second buffer 151 becomes logic high when both the external data strobe signal DS is logic high and the first single data rate mode signal CL1 is logic low, and becomes logic low when both the external data strobe signal DS is logic low and the first single data rate mode signal CL1 is logic low.

The second logic circuit 141 receives as an input the output of the second buffer 151 and the data strobe clock signal PCLKDS, and generates an internal data strobe signal PDS. The second logic circuit 141 includes a NAND gate 143 for performing a NAND operation on the internal clock signal PCLK and the output of the second buffer 151, and an inverter 145 for inverting the output of the NAND gate 143. Therefore, the internal data strobe signal PDS becomes logic low when either the output of the second buffer 151 or the data strobe clock signal PCLKDS is logic low, and becomes logic high when both the output of the second buffer 151 and the data strobe clock signal PCLKDS are logic high.

The first controller 161 receives as an input a data masking signal DM, the internal clock signal PCLK, the internal data strobe signal PDS, a second single data rate mode signal BL1 and a data masking enable signal DMEN. The first controller 161 generates a first internal masking signal DM_F and a second internal masking signal DM_S. The first controller 161 is synchronized with the internal clock signal PCLK and the internal data strobe signal PDS when the second single data rate mode signal BL1 is deactivated to logic low, and generates the first and second internal masking signals DM_F and DM_S in response to the data masking signal DM. When the second single data rate mode signal BL1 is activated to logic high, the first internal masking signal DM_F is generated in response to the data masking signal DM, and the second internal masking signal DM_S is activated to logic high.

The second controller 171 receives as an input data DINi, a buffer enable signal DINEN, the internal clock signal PCLK, the internal data strobe signal PDS, the first internal masking signal DM_F and the second internal masking signal DM_S. The second controller also outputs first data Did_F and second data Did_S. The second controller 171 is synchronized with a rising edge of the internal clock signal PCLK when the first internal masking signal DM_F is deactivated to logic low, and outputs the first data Did_F. The second controller 171 does not output the first data Did_F when the first internal masking signal DM_F is activated to logic high. The second controller 171 is synchronized with the falling edge of the internal clock signal PCLK when the second internal masking signal DM_S is deactivated, and outputs the second data Did_S. The second controller 171 does not output the second data Did_S when the second internal masking signal DM_S is activated to logic high.

Figure 2:
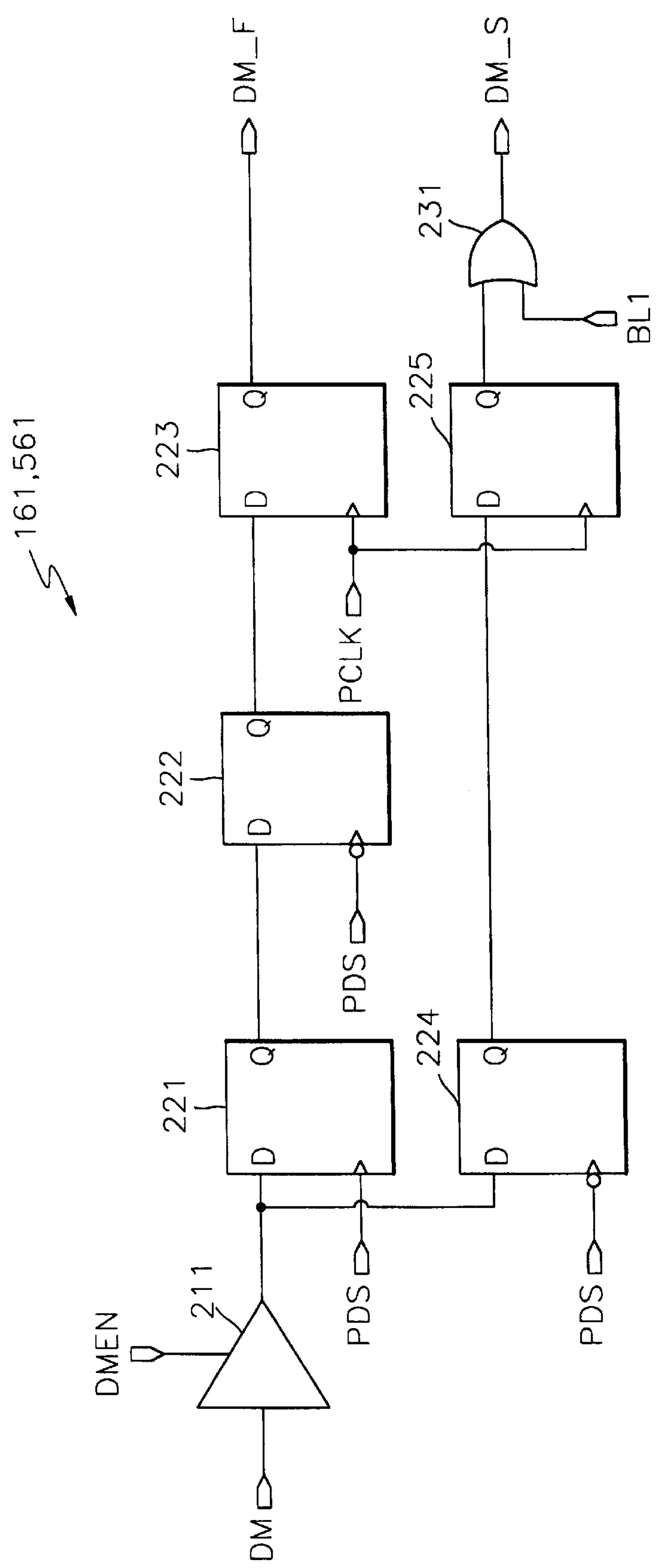
FIG. 2 is an electrical schematic of a first controller according to the embodiment of FIGS. 1 and 5.

FIG. 2 is a circuit diagram of the first controller 161 shown in FIG. 1. Referring to FIG. 2, the first controller 161 includes a buffer 211, first through fifth D flip-flops 221 through 225, and an OR gate 231. The buffer 211 receives as an input the data masking signal DM and is controlled by the data masking enable signal DMEN. Namely, the buffer 211 buffers the data masking signal DM when the data masking enable signal DMEN is activated to logic high, and does not generate an output when the data masking enable signal DMEN is disabled to logic low.

The first D flip-flop 221 receives as an input the output of the buffer 211 and the output of the buffer 211 is synchronized with the internal data strobe signal PDS. The second D flip-flop 222 receives as an input the output of the first D flip flop 221 and the output of the first D flip-flop 221 is synchronized with the inverted internal data strobe signal PDS. The third D flip-flop 223 receives as an input the output of the second D flip-flop 222 and the output of the third D flip-flop 223 (i.e., the first internal masking signal DM_F) is synchronized with the internal clock signal PCLK. The fourth D flip-flop 224 receives as an input the output of the buffer 211 and the output of the buffer 211 is synchronized with the inverted internal data strobe signal PDS. The fifth D flip-flop 225 receives as an input the output of the fourth D flip-flop 224 and the output of the fourth D flip-flop 224 is synchronized with the internal clock signal PCLK.

The OR gate 231 performs an OR operation on the output of the fifth D flip-flop 225 and the second single data rate mode signal BL1, and outputs the second internal masking signal DM_S. When either the output of the fifth D flip-flop 225 or the second single data rate mode signal BL1 is logic high, the second internal masking signal DM_S becomes logic high. When both the output of the fifth D flip-flop 225 and the second single data rate mode signal BL1 are logic low, the second internal masking signal DM_S becomes logic low. The second single data rate mode signal BL1 is activated to logic high when the burst length of the double data rate synchronous DRAM integrated circuit is 1.

Figure 3:
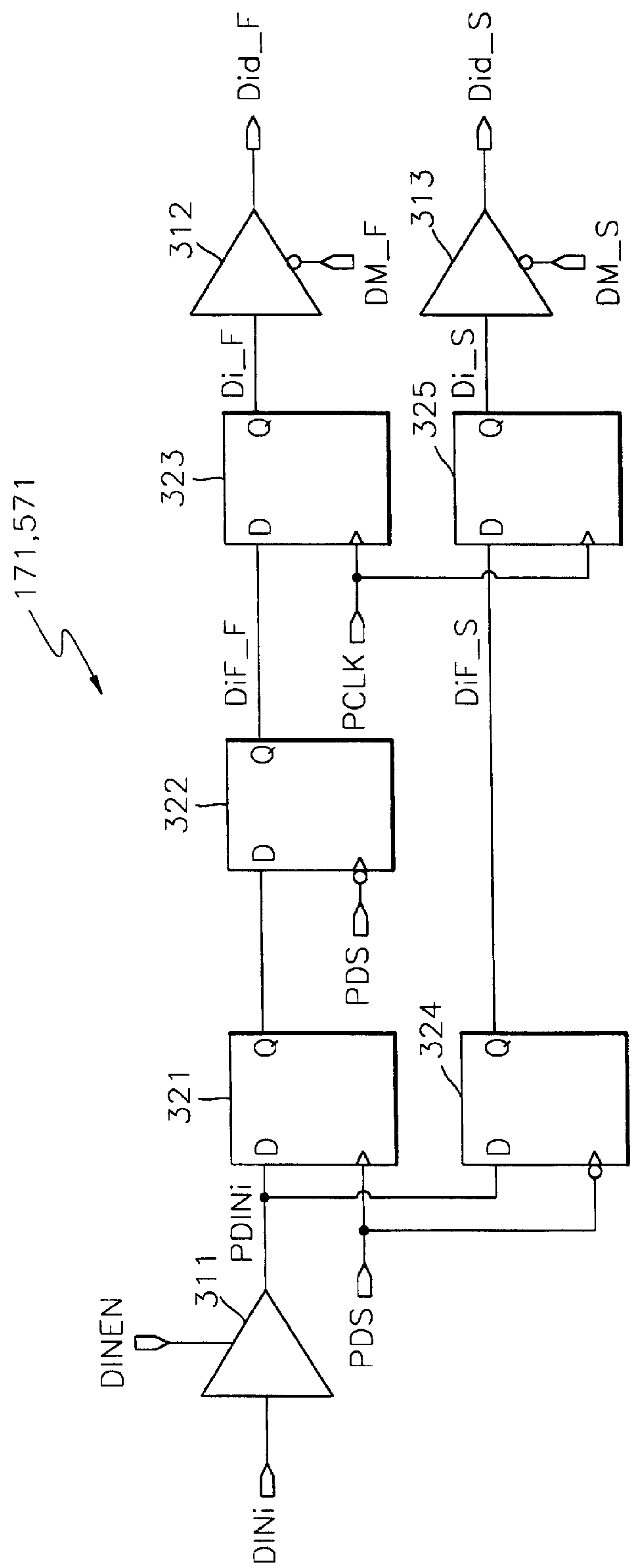
FIG. 3 is an electrical schematic of a second controller according to the embodiment of FIGS. 1 and 5.

FIG. 3 is a circuit diagram of the second controller 171 shown in FIG. 1. Referring to FIG. 3, the second controller 171 includes buffers 311, 312, and 313 and sixth through tenth D flip-flops 321 through 325. The buffer 311 receives as an input the data DINi from the outside and outputs data PDINi, controlled by the buffer enable signal DINEN. Namely the buffer 311 buffers the data DINi when the buffer enable signal DINEN is activated to logic high and outputs the data PDINi, and does not generate the data PDINi when the buffer enable signal DINEN is deactivated to logic low.

The sixth D flip-flop 321 receives as an input the data PDINi and outputs the data PDINi, synchronized with the internal data strobe signal PDS. The seventh D flip-flop 322 receives as an input the output of the sixth D flip-flop 321 and outputs the data DiF_F, synchronized with the inverted internal data strobe signal PDS. The eighth D flip-flop 323 receives as an input the data DIF_F and outputs the data Di_F, synchronized with the internal clock signal PCLK. The ninth D flip-flop 324 receives as an input the data PDINi and outputs the data DiF_S, synchronized with the inverted internal data strobe signal PDS. The tenth D flip-flop 325 receives as an input the data DIF_S and outputs the data Di_S, synchronized with the internal clock signal PCLK.

The buffer 312 receives as an input the data Di_F and outputs the data Did_F, controlled by the first internal masking signal DM_F. Namely, the buffer 312 does not output the data Did_F when the first internal masking signal DM_F is activated to logic high, but outputs the data Did_F, which is the same as the data Di_F, when the first internal masking signal DM_F is deactivated to logic low. The buffer 313 receives as an input the data Di_S and outputs the data Did_S, controlled by the second internal masking signal DM_S. The buffer 313 does not output the data Did_S when the second internal masking signal DM_S is activated, but outputs the data Did_S, which is the same as the signal Di_S, when the second internal masking signal DM_S is deactivated at a logic low.

Figure 4:
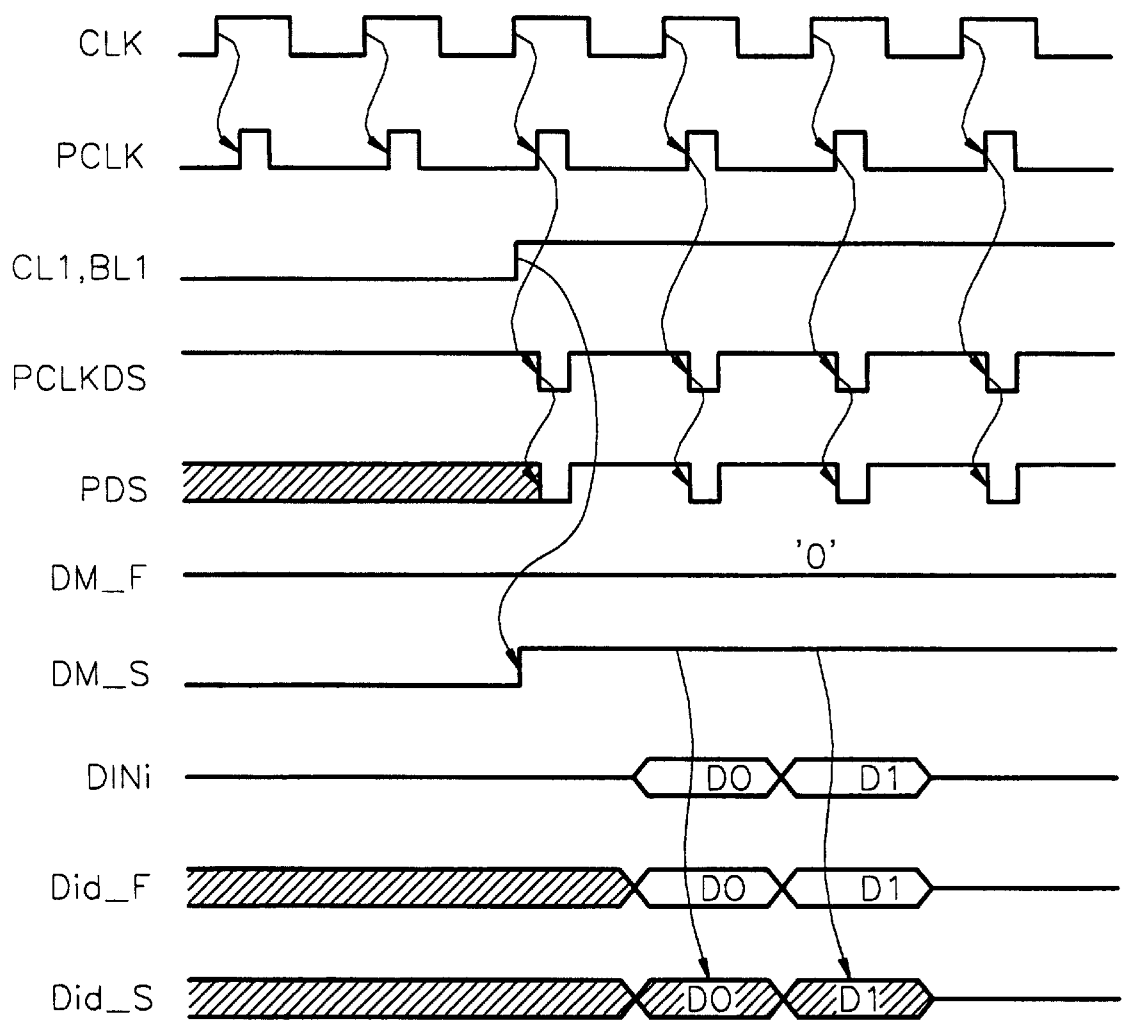
FIG. 4 is a timing diagram that illustrates operation of the device of FIG. 1.

FIG. 4 is a timing diagram of signals that illustrates operation of the device of FIG. 1. Referring to FIG. 4, when the first single data rate mode signal CL1 is logic low, the internal clock signal PCLK is generated in sync with the rising edge of the external clock signal CLK and the data strobe clock signal PCLKDS is maintained at logic high. Then, when the first and second single data rate mode signals CL1 and BL1 become logic high, the data strobe clock signal PCLKDS is generated as an inverted version of the internal clock signal PCLK (i.e., as logic 0 pulses), and the internal data strobe signal PDS is generated in response to the data strobe clock signal PCLKDS. When the second single data rate mode signal BL1 becomes logic high, the second internal masking signal DM_S becomes logic high from logic low. When the second internal masking signal DM_S becomes logic high, the second data Did_S is masked by the second internal masking signal DM_S. As a result, the data DINi that is received as an input from the outside of the second controller 171 it is not written in the synchronous DRAM integrated circuit. As described in FIGS. 1 through 4, when the first and second single data rate mode signals CL1 and BL1 are activated, the double data rate synchronous DRAM integrated circuit device operates in a single data rate mode. Therefore, it is possible to test a double data rate synchronous DRAM integrated circuit by writing data into the double data rate synchronous DRAM integrated circuit using low speed test equipment.

Figure 5:
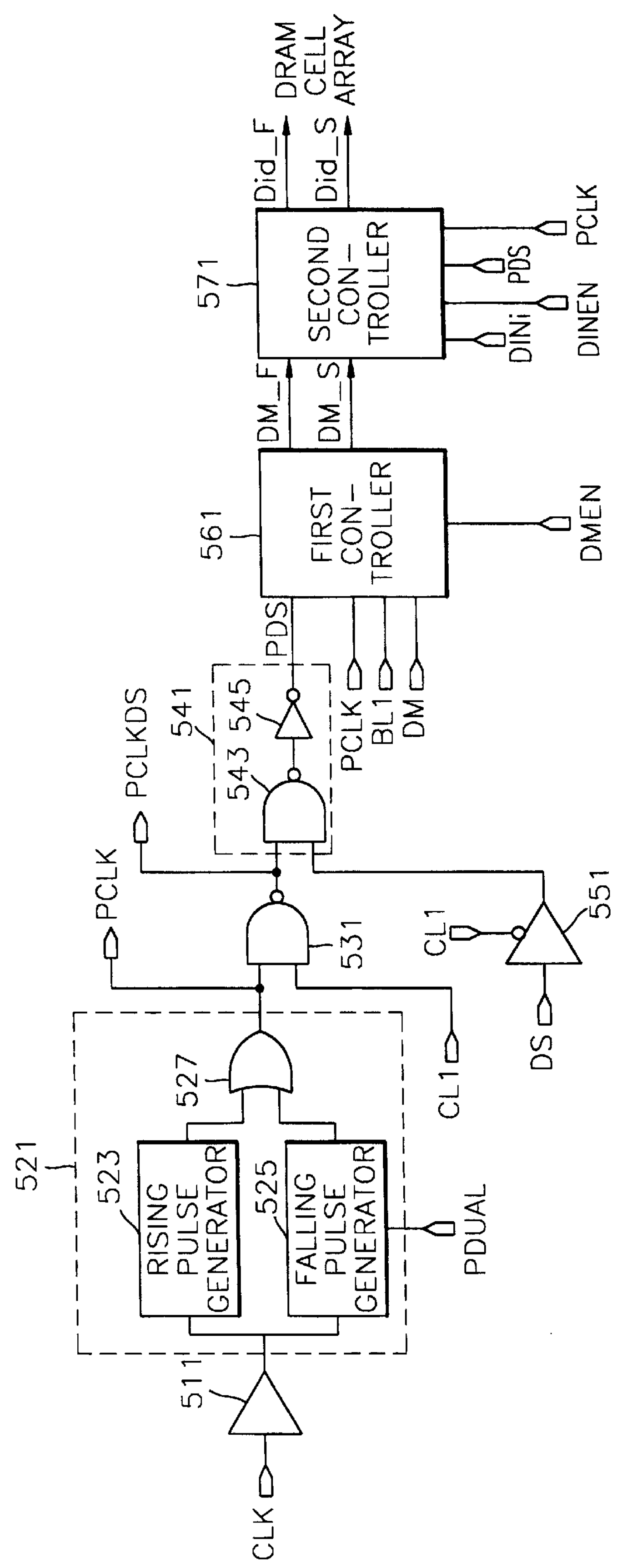
FIG. 5 is an electrical schematic of an integrated circuit memory device according to a second embodiment of the present invention.

FIG. 5 is a circuit diagram of a double data rate synchronous DRAM integrated circuit according to a second embodiment of the present invention. Referring to FIG. 5, the double data rate synchronous DRAM integrated circuit according to the second embodiment of the present invention includes first and second buffers 511 and 551, a pulse generator 521, first and second logic circuits 531 and 541, and first and second controllers 561 and 571. Since the first and second buffers 511 and 551, the first and second logic circuits 531 and 541, and the first and second controllers 561 and 571 have the same structure and perform the same operations as those of the circuits shown in FIG. 1, descriptions thereof will be omitted. The difference between the circuit shown in FIG. 1 and the circuit shown in FIG. 5 is in the pulse generator 121 of FIG. 1 and pulse generator 521 of FIG. 5.

The pulse generator 521 receives as an input the output of the first buffer 511 and generates the internal clock signal PCLK. The pulse generator 521 generates the internal clock signal PCLK at the rising and falling edges of the external clock signal CLK. The pulse generator 521 includes a rising pulse generator 523, a falling pulse generator 525, and a logic device 527. The rising pulse generator 523 receives as an input the output of the first buffer 511 and generates a pulse at the rising edge of the external clock signal CLK. The falling pulse generator 525 receives as an input the output of the first buffer 511 and a pulse control signal PDUAL received as an input and generates a pulse at the falling edge of the external clock signal CLK. Namely, the falling pulse generator 525 generates the pulse at the falling edge of the external clock signal CLK when the pulse control signal PDUAL is activated to a logic high and does not generate the pulse when the pulse control signal PDUAL is deactivated to a logic low.

The logic device 527 performs an OR operation on the output of the rising pulse generator 523 and the output of the falling pulse generator 525 and generates the internal clock signal PCLK. Accordingly, the logic device 527 outputs logic high when either the output of the rising pulse generator 523 or the output of the falling pulse generator 525 is logic high, and outputs logic low when both the output of the rising pulse generator 523 and the output of the falling pulse generator 525 are logic low. Therefore, when the pulse is generated in the rising pulse generator 523, the logic portion 527 outputs the pulse received from the rising pulse generator 523, and outputs the pulse generated in the falling pulse generator 525 when the pulse is received from the falling pulse generator 525.

Figure 6:
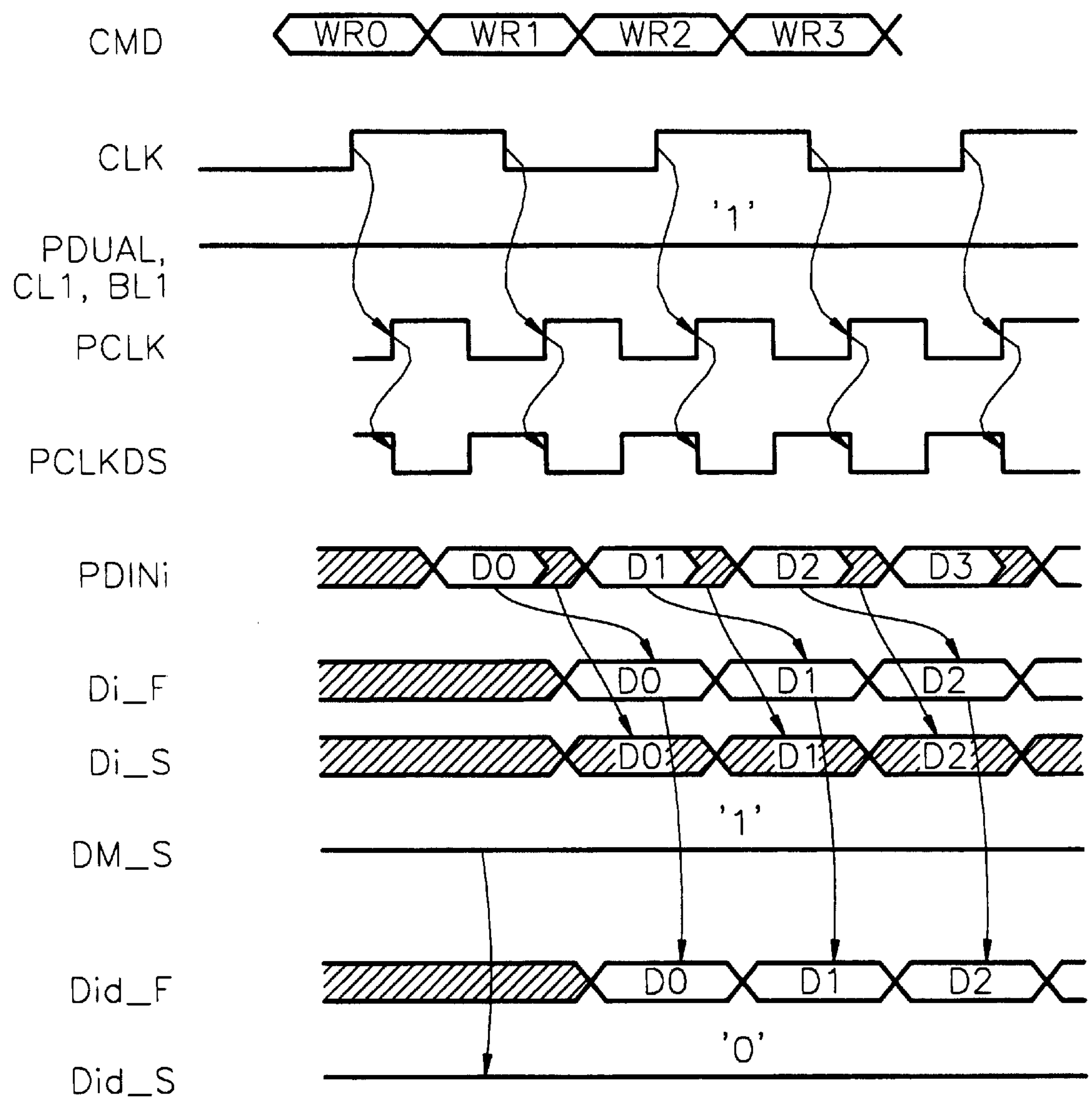
FIG. 6 is a timing diagram that illustrates operation of the device of FIG. 5.

FIG. 6 is a timing diagram of signals that illustrate operation of the device of FIG. 5. Referring to FIG. 6, commands are input at the rising and falling edges of the external clock signal CLK. Namely, the double data rate synchronous DRAM integrated circuit device operates in a dual edge clocking mode. When the pulse control signal PDUAL and the first single data rate mode signal CL1 are logic high, the internal clock signal PCLK is generated at the rising and falling edges of the external clock signal CLK. When the internal clock signal PCLK is generated, the data strobe clock signal PCLKDS is generated as an inverted version of the internal clock signal PCLK. When the data PDINi (shown in FIG. 3) is input, the data Di_F (shown in FIG. 3) is generated, and the data Did_F is generated by the data signal Di_F (shown in FIG. 3). When the second single data rate mode signal BL1 is logic high, the second internal masking signal DM_S becomes logic high. When the second internal masking signal DM_S becomes logic high, the data Did_S is not output and only the data Did_F is output even though the data PDINi is input.

Thus, as described in FIGS. 5 and 6, it is possible to operate the double data rate synchronous DRAM integrated circuit in a dual edge clocking mode (of the single data rate mode) by activating the first and second single data rate mode signals CL1 and BL1. Therefore, it is possible to test the double data rate synchronous DRAM integrated circuit at double the speed of the circuit shown in FIG. 1, by writing the data at double the speed of the circuit shown in FIG. 1 into the double data rate synchronous DRAM integrated circuit device using the low speed test device.

Figure 7:
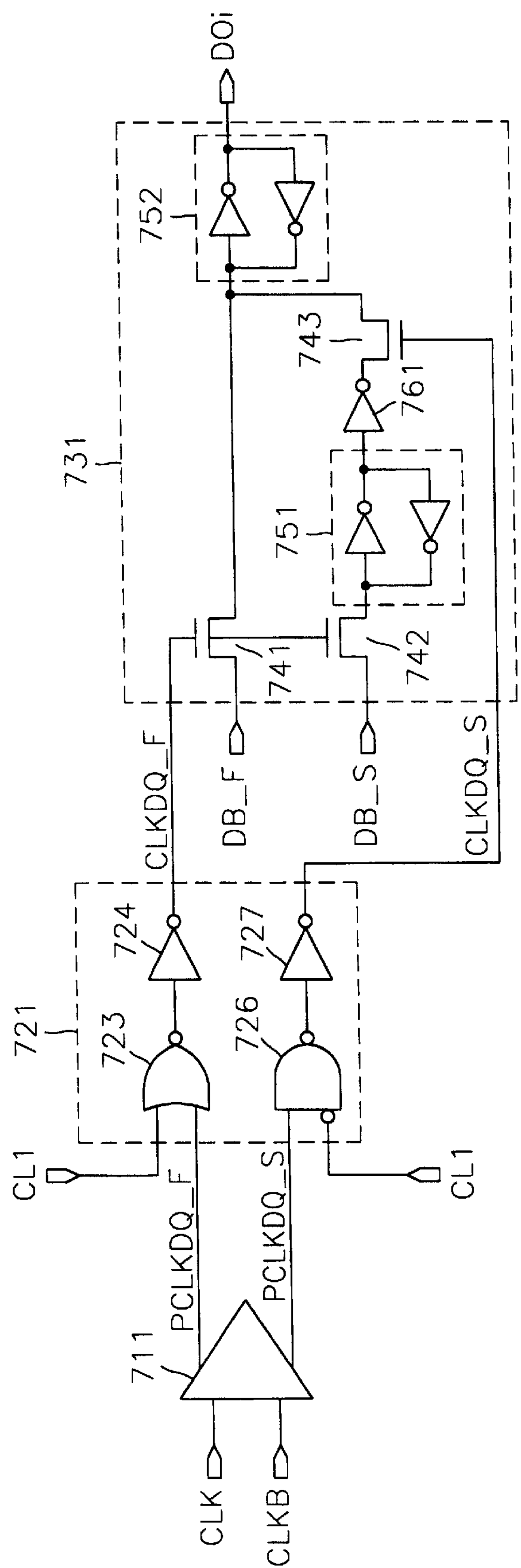
FIG. 7 is an electrical schematic of a preferred circuit for reading data from a memory cell array.

FIG. 7 is a circuit diagram of a double data rate synchronous DRAM integrated circuit according to a third embodiment of the present invention. The circuit shown in FIG. 7 is configured for reading data from the double data rate synchronous DRAM integrated circuit by operating the double data rate synchronous DRAM integrated circuit in the single data rate mode using the low speed test equipment. Referring to FIG. 7, the double data rate synchronous DRAM integrated circuit according to the third embodiment includes a buffer 71 1, a logic portion 721, and a controller 731. The buffer 711 receives as an input the external clock signal CLK and the inverted external clock signal CLKB, and outputs signals PCLKDQ_F and PCLKDQ_S. The logic portion 721 receives as an input the signals PCLKDQ_F and PCLKDQ_S and the first single data rate mode signal CL1, and generates first and second control signals CLKDQ_F and CLKDQ_S. The logic portion 721 generates the first and second control signals CLKDQ_F and CLKDQ_S in response to the external clock signal CLK when the first single data rate mode signal CL1 is deactivated to logic low. The logic portion 721 activates the first control signal CLKDQ_F to logic high and deactivates the second control signal CLKDQ_S to logic low when the first single data rate mode signal CL1 is activated to logic high. The first single data rate mode signal CL1 is activated when the CAS latency of the double data rate synchronous DRAM integrated circuit is 1.

The logic portion 721 includes logic circuits 723 and 724, and logic circuits 726 and 727. The logic circuits 723 and 724 respectively include a NOR gate 723 and an inverter 724. The logic circuits 726 and 727 respectively include a NAND gate 726 and an inverter 727. The NOR gate 723 receives as inputs the single data rate mode signal CL1 and the signal PCLKDQ_F and performs a NOR operation on them. Namely, the NOR gate 723 outputs logic low when either the first single data rate mode signal CL1 or the signal PCLKDQ_F is logic high, and outputs logic high when both the single data rate mode signal CL1 and the signal PCLKDQ_F are logic low. The inverter 724 inverts the output of the NOR gate 723 and outputs a first control signal CLKDQ_F. The NAND gate 726 receives as inputs an inverted version of the first single data rate mode signal CL1 and the signal PCLKDQ_S and performs a NAND operation on them. Namely, the NAND gate 726 outputs logic high when either the inverted version of the first single data rate mode signal CL1 or the signal PCLKDQ_S is logic low, and outputs logic low when both the inverted version of the first single data rate mode signal CL1 and the signal PCLKDQ_S are logic high. The inverter 727 inverts the output of the NAND gate 726 and outputs the second control signal CLKDQ_S.

A controller 731 receives as inputs the first and second data signals DB_F and DB_S and is controlled by the first and second control signals CLKDQ_F and CLKDQ_S. When the first and second control signals CLKDQ_F and CLKDQ_S are deactivated to logic low, the first and second data signals DB_F and DB_S are not output. When only the first control signal CLKDQ_F is activated to logic high, only the first data DB_F is output. When the first and second control signals CLKDQ_F and CLKDQ_S are activated to logic high, the first and second data signals DB_F and DB_S are output. The controller 731 includes first through third switching devices 741 through 743, first and second latches 751 and 752 and an output inverter 761.

The first switching device 741, which receives as an input the first data DB_F and outputs the first data DB_F, is controlled by the first control signal CLKDQ_F. The first switching device 741 comprises an NMOS transistor to which the first control signal CLKDQ_F is applied at the gate and the first data DB_F is applied at the drain. Therefore, the first switching device 741 is turned on when the first control signal CLKDQ_F is logic high and outputs the first data DB_F. The first switching device is turned off when the first control signal CLKDQ_F is logic low and does not output the first data DB_F. The second switching device 742, which receives as an input the second data DB_S and outputs the second data DB_S, is controlled by the first control signal CLKDQ_F. The second switching device 742 includes an NMOS transistor to which the first control signal CLKDQ_F is applied at the gate and the second data DB_S is applied at the drain. Therefore, the second switching device 742 is turned on when the first control signal CLKDQ_F is logic high and outputs the second data DB_S. The second switching device is turned off when the first control signal CLKDQ_F is logic low and does not output the second data DB_S.

The first latch 751 latches and outputs the output of the second switching device 742. The third switching device 743, which receives as an input the second data DB_S output from the first latch 751 and outputs the second data DB_S, is controlled by the second control signal CLKDQ_S. The third switching device 743 includes an NMOS transistor to which the second control signal CLKDQ_S is applied at the gate and the second data DB_S is applied at the drain. Therefore, the third switching device 743 is turned on when the second control signal CLKDQ_S is logic high and outputs the second data DB_S. The third switching device is turned off when the second control signal CLKDQ_S is logic low and does not output the second data DB_S. The second latch 752 inverts the first and second data DB_F and DB_S, respectively, output from the first and third switching devices 741 and 743, and latches and outputs the first and second data. Output data DOi of the controller 731 is output from the second latch 752.

Figure 8:
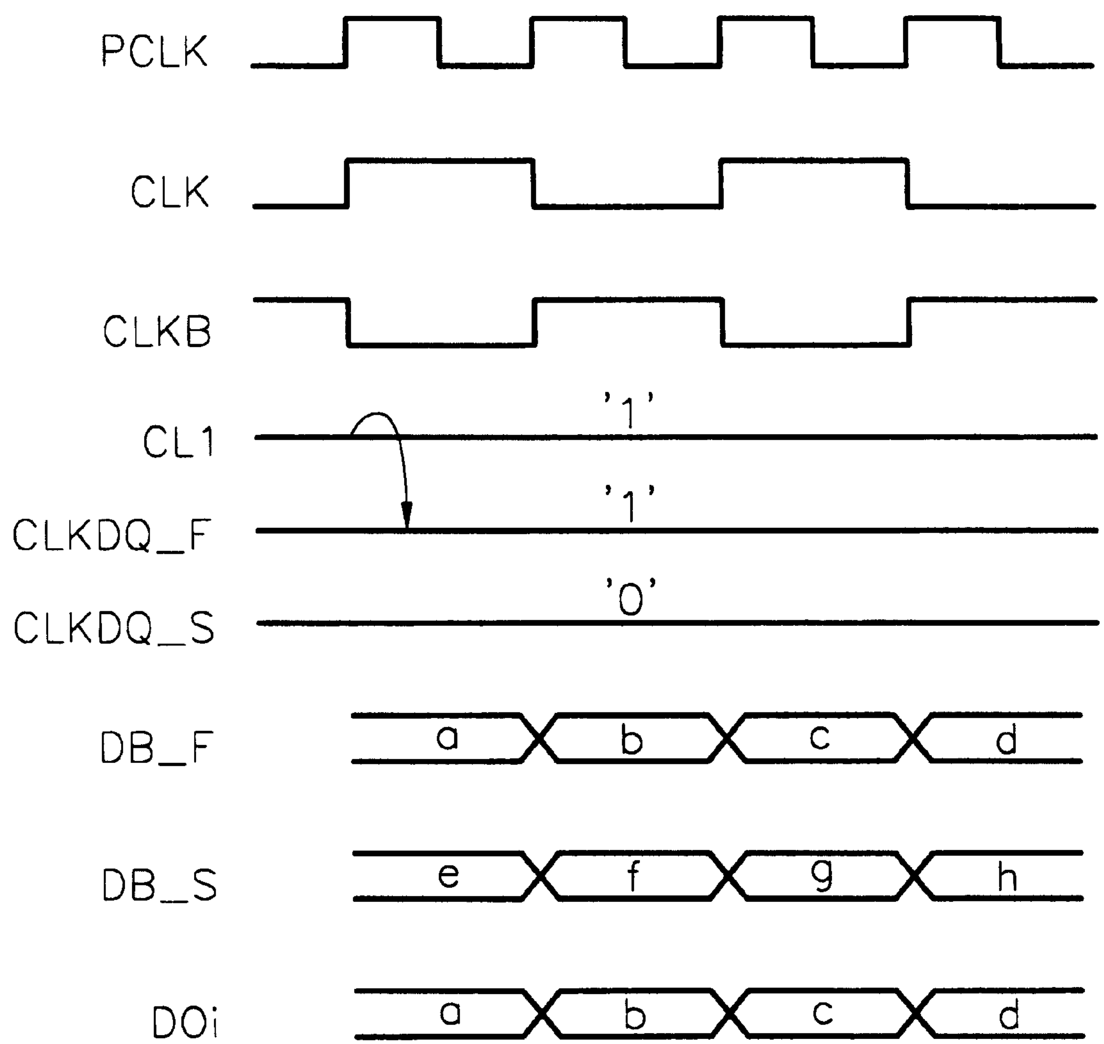
FIG. 8 is a timing diagram that illustrates operation of the circuit of FIG. 7.

FIG. 8 is a timing diagram of signals that illustrate operation of the device of FIG. 7. Referring to FIG. 8, the internal clock signal PCLK is generated at the rising and falling edges of the external clock signal CLK. When the first single data rate mode signal CL1 is logic high, the first control signal CLKDQ_F is activated to a logic high and the second control signal CLKDQ_S is deactivated to a logic low. When the first control signal CLKDQ_F is a logic high, the first data DB_F is output as the output data DOi of the controller 731, however, the second data DB_S is not output as the output data DOi of the controller 731. Thus, as described in FIGS. 7 and 8, when the first single data rate mode signal CL1 is activated, the double data rate synchronous DRAM integrated circuit operates in the single data rate mode. Therefore, it is possible to test the double data rate synchronous DRAM integrated circuit by reading the internal data of the double data rate synchronous DRAM integrated circuit with the low speed test equipment.

According, as explained above with respect to FIGS. 1–8, it is possible to test the double data rate synchronous DRAM integrated circuit with the low speed test equipment by activating the first and second single data rate mode signals CL1 and BL1, and operating the double data rate synchronous DRAM integrated circuit in the single data rate mode.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A double data rate synchronous DRAM integrated circuit, comprising:

a first buffer for changing the voltage level of an external clock signal;

a pulse generator for receiving as input the output of the first buffer, generating a pulse at the rising edge of the external clock signal, and outputting the pulse as an internal clock signal;

a first logic circuit for receiving as input a single data rate mode signal input from the outside and the internal clock signal, and generating a data strobe clock signal;

a second buffer for receiving as input an external data strobe signal and the single data rate mode signal, and changing the voltage level of the external data strobe signal in response to the single data rate mode signal; and a second logic circuit for receiving as input the output of the second buffer and the data strobe clock signal and generating an internal data strobe signal.

2. The double data rate synchronous DRAM integrated circuit of claim 1, wherein the first logic circuit outputs the data strobe clock signal in response to the internal clock signal when the single data rate mode signal is activated, and does not output the data strobe clock signal when the single data rate mode signal is deactivated.

3. The double data rate synchronous DRAM integrated circuit of claim 1, wherein the second buffer outputs a logic high when the single data rate mode signal is activated and generates an output in response to the external data strobe signal when the single data rate mode signal is deactivated.

4. The double data rate synchronous DRAM integrated circuit of claim 1, wherein the second logic circuit performs an AND operation on the output of the second buffer and the data strobe clock signal, and generates the internal data strobe signal.

5. The double data rate synchronous DRAM integrated circuit of claim 1, wherein the single data rate mode signal is activated when the CAS latency of the double data rate synchronous DRAM integrated circuit is 1.

6. The double data rate synchronous DRAM integrated circuit of claim 1, further comprising a first controller for generating first and second internal masking signals by receiving as input a data masking signal from the outside, the internal clock signal, the internal data strobe signal, and another single data rate mode signal, generating both the first and second internal masking signals in response to the data masking signal received as input from the outside) synchronized with the internal clock signal and the internal data strobe signal when the other single data rate mode signal is deactivated, and generating the first internal masking signal in response to the data masking signal received as input from the outside when the other single data rate mode signal is activated, and activating the second internal masking signal.

7. The double data rate synchronous DRAM integrated circuit of claim 6, wherein the other single data rate mode signal is activated when the burst length of the double data rate synchronous DRAM integrated circuit is 1.

8. The double data rate synchronous DRAM integrated circuit of claim 6, further comprising a second controller for outputting first and second data in response to data input from the outside, the internal clock signal, the internal data strobe signal, the first internal masking signal, and the second internal masking signal, outputting the first data synchronized with the rising edge of the internal clock signal when the first internal masking signal is deactivated, not outputting the first data when the first internal masking signal is activated, outputting the second data synchronized with the falling edge of the internal clock signal when the second internal masking signal is deactivated, and not outputting the second data when the second internal masking signal is activated.

9. The double data rate synchronous DRAM integrated circuit of claim 1, wherein the pulse generator comprises:

a rising pulse generator for receiving as input the output of the first buffer and generating a pulse at the rising edge of the external clock signal;

a falling pulse generator for receiving as input the output of the first buffer and a pulse control signal from the outside, generating a pulse at the falling edge of the external clock signal when the pulse control signal is activated, and not generating the pulse when the pulse control signal is deactivated; and a logic portion for generating an internal clock signal by combining the output of the rising pulse generator with the output of the falling pulse generator.

10. The double data rate synchronous DRAM integrated circuit of claim 9, wherein the logic portion is a logic gate for performing an OR operation on the output of the rising pulse generator and the output of the falling pulse generator.

11. A double data rate synchronous DRAM integrated circuit, comprising:

a buffer for inputting a clock signal;

a logic portion for generating first and second control signals by receiving as input the output of the buffer and a single data rate mode signal, outputting the first and second control signals in response to the clock signal when the single data rate mode signal is deactivated, and activating the first control signal and deactivating the second control signal when the single data rate mode signal is activated; and a controlling portion for receiving as input first and second data, not outputting the first and second data when both the first and second control signals are deactivated, outputting only the first data when only the first control signal is activated, and outputting the first and second data when both the first and second control signals are activated.

12. The double data rate synchronous DRAM integrated circuit of claim 11, wherein the logic portion comprises:

a logic circuit for performing an OR operation on the output of the buffer and the single data rate mode signal, and outputting the first control signal; and another logic circuit for performing an AND operation on the output of the buffer and an inverse of the single data rate mode signal, and outputting the second control signal.

13. The double data rate synchronous DRAM integrated circuit of claim 11, wherein the single data rate mode signal is activated when the CAS latency of the double data rate synchronous DRAM integrated circuit is 1.

14. The double data rate synchronous DRAM integrated circuit of claim 11, wherein the controller comprises:

a first switching portion for receiving as input the first data and outputting the first data, controlled by the first control signal;

a second switching portion for receiving as input the second data and outputting the second data, controlled by the first control signal;

a latch for latching the output of the second switching portion;

a third switching portion for receiving as input the output of the latch and outputting the output of the latch, controlled by the second control signal; and another latch for latching the outputs of the first and second switching portions.

* * * * *